United States Patent
Chandna et al.

(10) Patent No.: US 6,624,056 B2
(45) Date of Patent: Sep. 23, 2003

(54) METHODS AND APPARATUS FOR PROVIDING IMPROVED PHYSICAL DESIGNS AND ROUTING WITH REDUCED CAPACITIVE POWER DISSIPATION

(75) Inventors: Ajay Chandna, Austin, TX (US); Tom O'Brien, Austin, TX (US); David Lyndell Brown, Austin, TX (US)

(73) Assignee: PTS Corporation, San Jose, CA (US)

( * ) Notice: Subject to any disclaimer, the term of this patent is extended or adjusted under 35 U.S.C. 154(b) by 0 days.

(21) Appl. No.: 10/004,578

(22) Filed: Dec. 4, 2001

(65) Prior Publication Data

US 2002/0106878 A1 Aug. 8, 2002

Related U.S. Application Data (60) Provisional application No. 60/251,072, filed on Dec. 4, 2000.

(51) Int. Cl.[7] .................. H01L 21/3205; H01L 21/4763
(52) U.S. Cl. ..................................... 438/586
(58) Field of Search ............................. 438/586, 618; 257/202, 207, 208, 211; 716/5; 712/11, 20, 15; 703/14; 326/93, 41, 38; 714/724

(56) References Cited

U.S. PATENT DOCUMENTS

| | | | | |
|---|---|---|---|---|
| 5,404,033 A | * | 4/1995 | Wong et al. ................ 257/202 |
| 5,444,276 A | * | 8/1995 | Yokota et al. .............. 257/207 |
| 5,602,406 A | * | 2/1997 | Okabe ....................... 257/207 |
| 5,717,943 A | * | 2/1998 | Barker et al. ................ 712/20 |
| 5,742,078 A | * | 4/1998 | Lee et al. ................... 257/202 |
| 5,767,011 A | * | 6/1998 | Yao et al. ................... 438/618 |
| 5,814,846 A | * | 9/1998 | Essbaum et al. ............ 257/207 |
| 5,969,544 A | * | 10/1999 | Iwao et al. ................... 326/93 |
| 5,977,574 A | * | 11/1999 | Schmitt et al. ............. 257/207 |
| 5,990,502 A | * | 11/1999 | Park ........................... 257/202 |
| 6,081,005 A | * | 6/2000 | Fuchigami et al. ......... 257/208 |
| 6,160,420 A | * | 12/2000 | Gamal et al. ................ 326/41 |
| 6,167,502 A | * | 12/2000 | Pechanek et al. ............ 712/15 |
| 6,169,416 B1 | * | 1/2001 | Eaton et al. ................. 326/38 |
| 6,177,691 B1 | * | 1/2001 | Iranmanesh et al. ........ 257/211 |
| 6,185,706 B1 | * | 2/2001 | Sugasawara ................ 714/724 |
| 6,255,675 B1 | * | 7/2001 | Trimberger ................ 257/208 |
| 6,405,299 B1 | * | 6/2002 | Vorbach et al. .............. 712/11 |
| 6,470,304 B1 | * | 10/2002 | Mali et al. .................... 703/14 |

* cited by examiner

*Primary Examiner*—Vu A. Le
*Assistant Examiner*—Michael K. Luhrs
(74) *Attorney, Agent, or Firm*—Priest & Goldstein, PLLC (57) ABSTRACT

Techniques are described for semiconductor chips with reduced capacitive power dissipation as a result of improved conductor line spacing. The approaches are particularly applicable to 0.25 micron chip design processes and below. According to one aspect, where there are n available metallization layers available to the designer, a smaller number of layers, such as n−1, are utilized initially in developing a routing design. Then, at least one further metallization layer is used to systematically route conductors, such as bus conductors, to increase the number of metal pitches between conductors, by promoting conductors from one layer to another.

17 Claims, 6 Drawing Sheets

METHODS AND APPARATUS FOR PROVIDING IMPROVED PHYSICAL DESIGNS AND ROUTING WITH REDUCED CAPACITIVE POWER DISSIPATION

The present invention claims the benefit of U.S. Provisional Application Serial No. 60/251,072 entitled "Methods And Apparatus for Providing Improved Physical Designs and Routing with Reduced Capacitive Power Dissipation" filed Dec. 4, 2000, which is incorporated by reference herein in its entirety.

FIELD OF INVENTION

The present invention relates generally to improvements to integrated circuit layout and design. More particularly, the present invention addresses methods and apparatus for parallel line layouts having reduced capacitive power dissipation.

BACKGROUND OF THE INVENTION

As process technology advances, metal lines utilized to connect components on semiconductor chips are getting narrower and narrower. The spacing between such lines is getting smaller, and in order to minimize the impact on line resistance, these metal lines are being made taller. As a result, a dominant component of capacitance of such a line is the coupling capacitance between adjacent lines on the same metallization layer.

Commercially available place and route design tools give users the ability to specify wider spacing rules for specific materials, connections and the like. For example, it is common practice to use this approach to minimize delay and power loss associated with specific networks of connections such as clock networks in a design.

Further, in the literature, a technique has been instrumented which is sometimes referred to as "power driven placement". In this approach, signals with a high level of switching activity are identified through dynamic simulation of the design. By placing the devices and receivers associated with these signals closer together during cell placement, the net capacitance is reduced and so is the power. This technique is built upon timing-driven placement algorithms which place cells closer together if it helps the design to achieve its timing constraints.

SUMMARY OF THE INVENTION

Among its several aspects, the present invention addresses the reduction of the coupling capacitance between conductors on the same metallization layer. Modern integrated circuits are often built using at least five or six layers of metallization. Most circuits including custom circuits and standard-cell based circuits can achieve fairly good densities using only three layers of metal. The fourth, fifth and sixth layers of metal are often used for power distribution, clock distribution and inter-module routing for system-on-a-chip designs. In general terms, the present invention provides methods and apparatus for systematically increasing spacing between conductors on a given metal layer from one or more metal pitches to a greater number of metal pitches by using higher layers of metal to route signals in the spaces between alternating conductors on the underlying metal layer. Metal pitches used in placed and routed designs are most frequently based on, but not limited to, line-to-via spacing and via-to-via spacing. As addressed further below, the present techniques can be applied to, but are not limited to, both standard cell designs and custom designs. They are particularly applicable for 0.25 micron ($\mu$m) chip design processes and below.

These and other advantages and aspects of the present invention will be apparent from the drawings and the Detailed Description which follows below.

DETAILED DESCRIPTION

Figure 1:
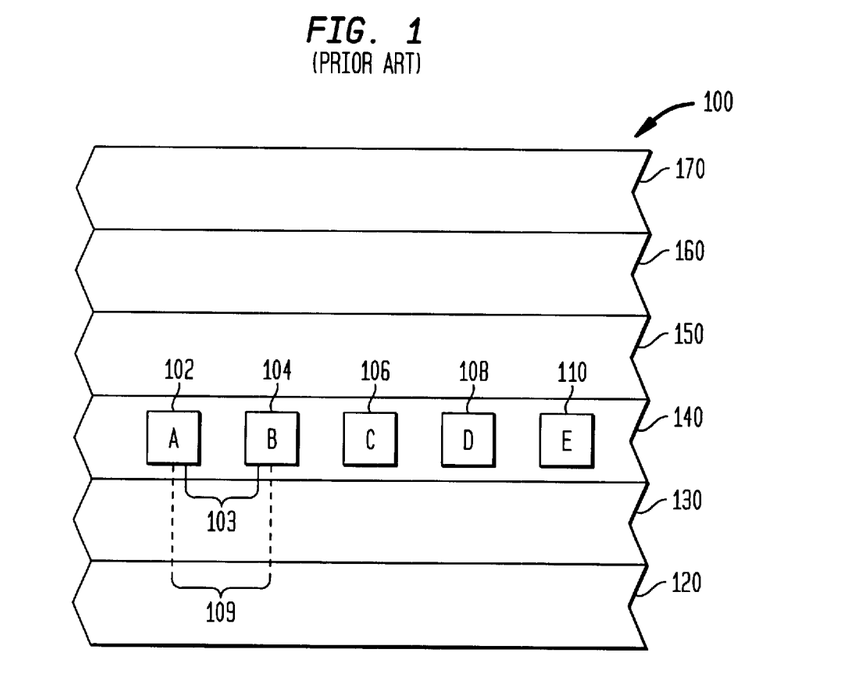
FIG. 1 illustrates a prior art routing approach in which five signals A–E are all routed in parallel metal lines on the same metallization layer, "metal 3", of an integrated circuit.

As an example to illustrate various aspects of the present invention, FIG. 1 shows a cross-section 100 of six metallization layers, metal 1, metal 2, metal 3, metal 4, metal 5, and metal 6, 120–170, respectively. A set of five conductors 102, 104, 106, 108, and 110 spaced by an edge to edge spacing 103 or single metal pitch 109 measured center to center. Those conductors carrying signals A, B, C, D and E are all routed on metal 3, layer 140, before the implementation of the approach of the present invention.

Figure 2:
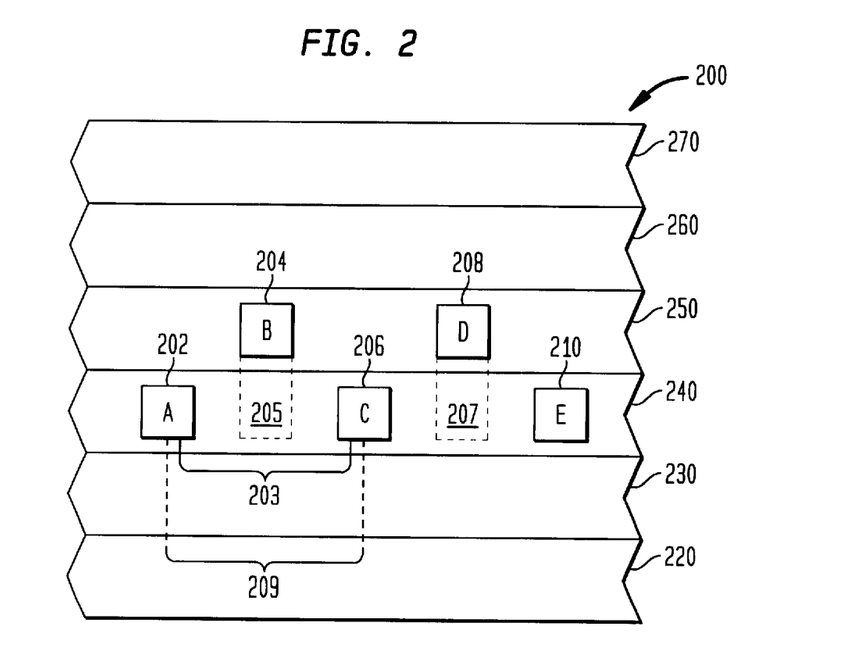
FIG. 2 illustrates a routing in accordance with the present invention in which the same five signals have been assigned to two different metallization layers, metal 3 and metal 4.

By contrast, FIG. 2 shows a simplified cross-sectional view 200 of the design after implementation of the present technique. Again, six metallization layers 220–270 and a set of five conductors 202, 204, 206, 208, and 210 are shown. Now, however, signals B and D carried by conductors 204 and 208, respectively, are routed on metal 4, layer 250. By using, for example, only the three layers of 220, 230, and 240 in an original routing pattern prior to promotion as discussed in greater detail below, the fourth layer is kept open, thereby allowing a promotion of signals B and D to metal 4, layer 250. In FIG. 2, all conductors 202, 204, 206, 208, and 210 are now spaced apart from other neighboring conductors on the same layer by a spacing 203 or two metal pitches 209 rather than one spacing 103 or one metal pitch 109 as in FIG. 1. Vias 205 and 207 are fabricated to establish a connection from the level of the conductors 204 and 208 for signals B and D of FIG. 2, for example, to the level of the conductors 202, 206, and 210 for signals A, C, and E.

Today's place and route tools perform a very large percentage of their routing on grids. The technique described here provides a systematic approach to avoid routing of signals within certain grids and allowing routing in that same grid on a different layer of metal. One example would be to route vertical metal lines that fall on odd grid lines in metal 2, to route vertical metal lines that fall on even grid lines in metal 3, to route horizontal metal lines that fall on odd grid lines in metal 4, and to route horizontal metal lines that fall on even grid lines in metal 5. The impact of this exemplary arrangement is to make the minimum space between conductors on metal 2, metal 3, metal 4 and metal 5 between two to three times their original spacing, thereby significantly reducing the coupling component of capacitance in the design. With the advent of an even larger number of metal layers in processing technology, the present approach can be extended to increase the spacing between neighboring conductors by an even larger amount.

There are several ways to implement the present invention. One exemplary approach is to route a design using a smaller number of layers of metal, such as three layers of metal and then to post-process the route by promoting alternating metal tracks to higher metal layers. Another approach is to build a software process to implement the inventive approach into the routing tool so that it knows to prefer certain metal layers for certain track assignments.

Figure 3:
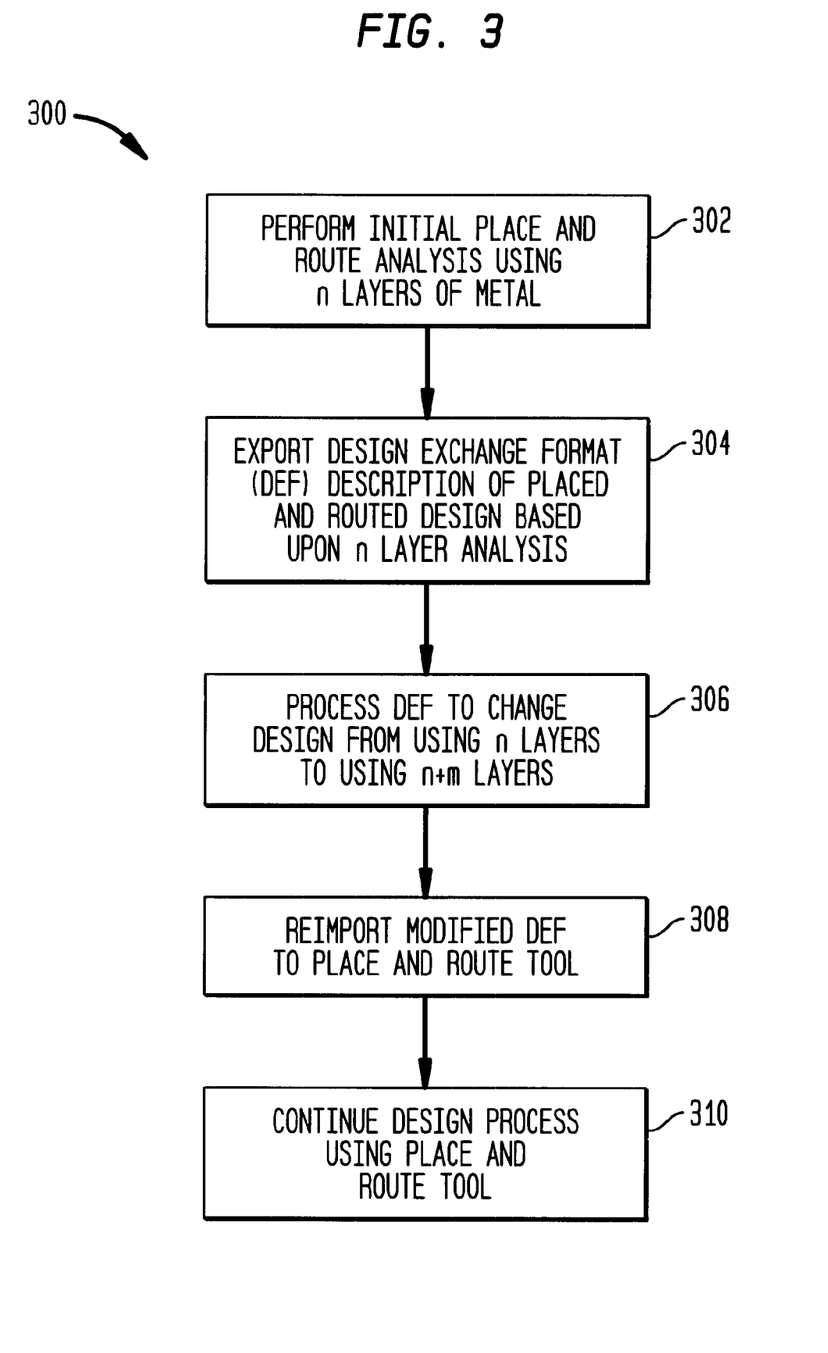
FIG. 3 illustrates an overall flowchart of a process for design and routing with reduced capacitive power dissipation.

FIG. 3 illustrates an overall method 300 for providing improved physical design and routing with reduced capacitive power dissipation which builds on an existing place and route tool. In step 302 of method 300, an initial place and route analysis is performed using n layers of metal. For example, with a layout with six metallization layers as illustrated in FIGS. 1 and 2, n might be equal to 4. Thus, with n=4, step 302 causes all of the connections required by a design to be placed and routed using four metallization layers and a design exchange format (DEF) description is generated.

Figure 4A:
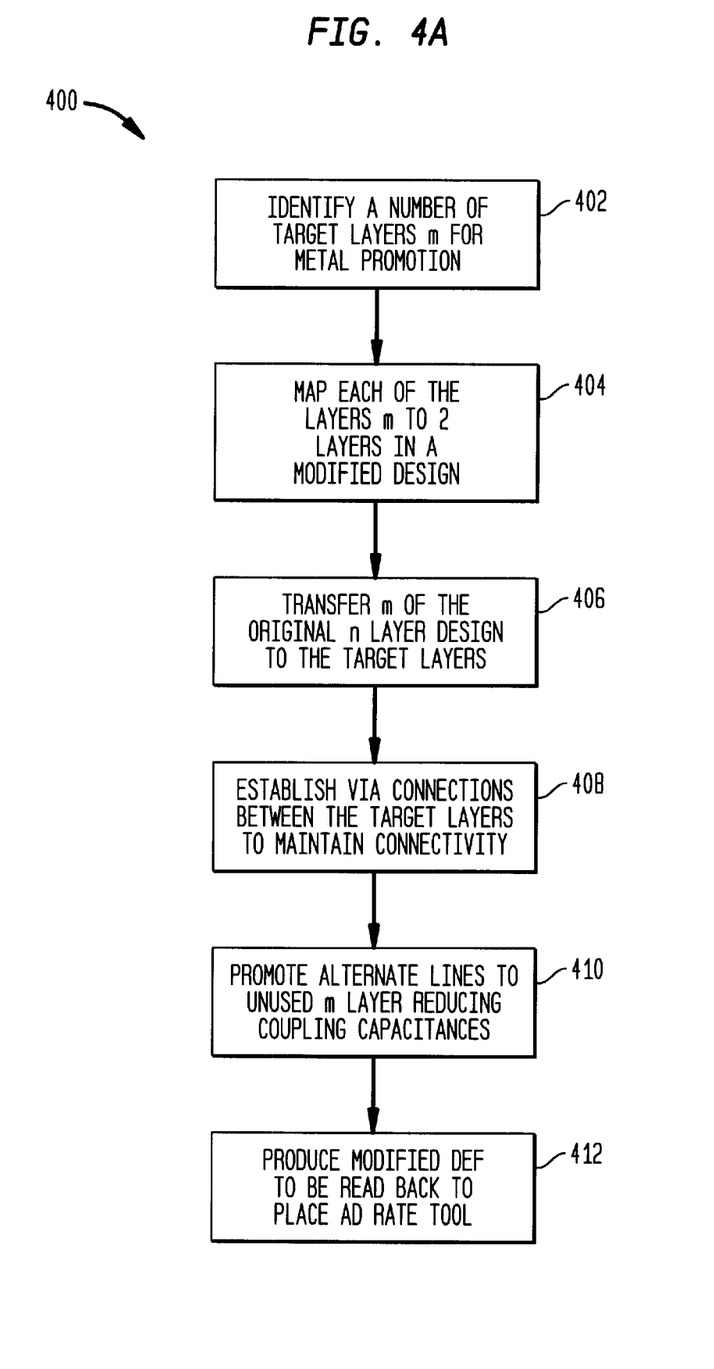
FIG. 4A illustrates an exemplary subroutine for translating a standard design exchange format (DEF) from using n layers to using n plus m layers with metallization promotion in accordance with the present invention.

In step 304, the DEF is exported to a process or subroutine 400 shown in FIG. 4 and described in greater detail below. In step 306, subroutine 400 processes the DEF from step 304 to change the design from using n layers to using n plus m layers, and a modified DEF is generated. In step 308, the modified DEF is reimported back into the place and route tool. Finally, in step 310, the design process continues to completion addressing such issues as timing analysis, post-place and route operations, and the like.

Turning to details of subroutine 400, as seen in FIG. 4, this process begins in step 402 by identifying a number of target layers m for metal promotion. In the example of FIG. 2, m=1. For the example where n=4 begun in the discussion of FIG. 3 above, let us assume m=2 so that original metal layers 1 and 2 are to be left unchanged and original metal layers 3 and 4 are candidates for promotion. In step 404, each of the target layers m identified in step 402 are mapped to two layers in a modified design. While the presently preferred embodiment maps one target layer to two layers in the modified design, it will be recognized that other mappings can be employed. For example, one layer could be mapped to three layers or two layers might be mapped to three layers, or some other variation. Next, in step 406, m of the original n layers design layers are transferred to the target layers. In step 408, via connections are established between the target layers to maintain the original connectivity.

In step 410, alternate lines are promoted to the unused m layers thereby reducing coupling capacitances between metallization lines in the same layers. Again, vias are established to maintain the original connectivity. Finally, a modified DEF is generated and read back to the place and route tool.

Figure 4B:
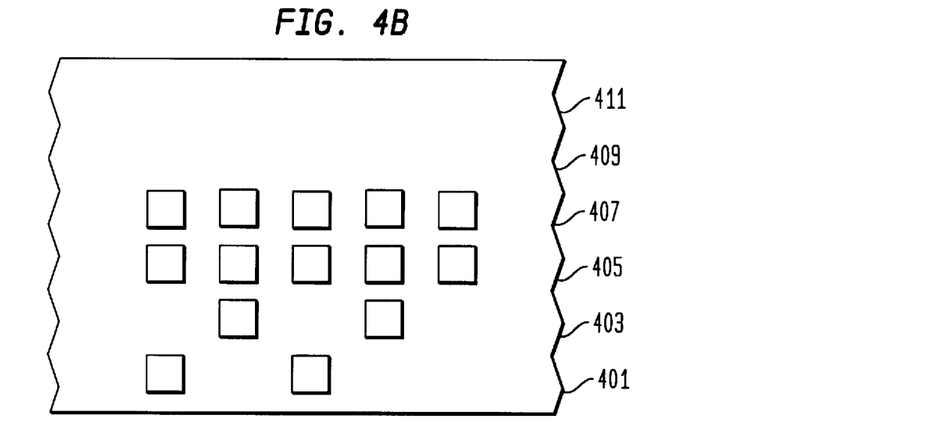
FIGS. 4B–4D illustrate an example of how the subroutine of FIG. 4A translates a standard DEF to a modified DEF with reduced capacitive power dissipation.

Continuing with the above example and returning to FIGS. 4B–4D, the original design is routed with four layers of metal 401, 403, 405, and 407 as seen in FIG. 4B. In step 402, it is determined that process 400 will be applied to promote two layers (m=2), layers 405 and 407. By way of example, the decision to promote these layers may be based on an analysis of layers 405 and 407 which shows that the conductors in those layers are separated by one pitch while those in layers 401 and 403 are separated by two pitches. It will be recognized that other analyses and decision bases may be employed. For example, promotion may be based on signal type or frequency of signal switching on the conductors.

Figure 4C:
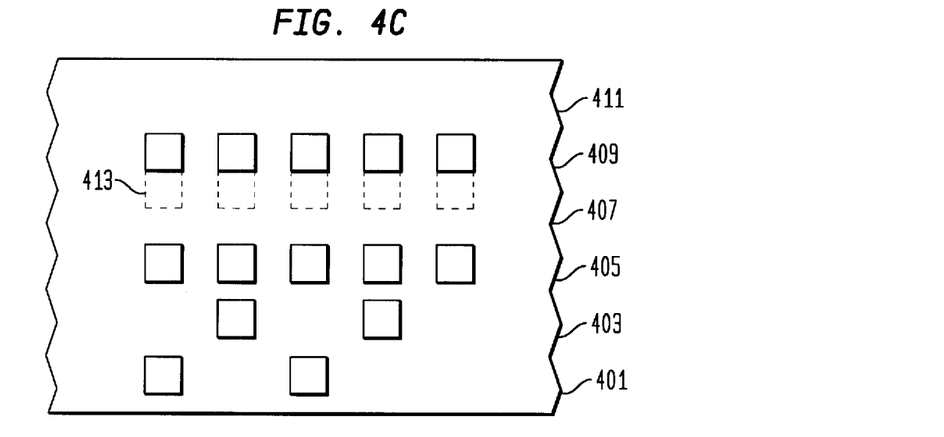
Figure 4D:
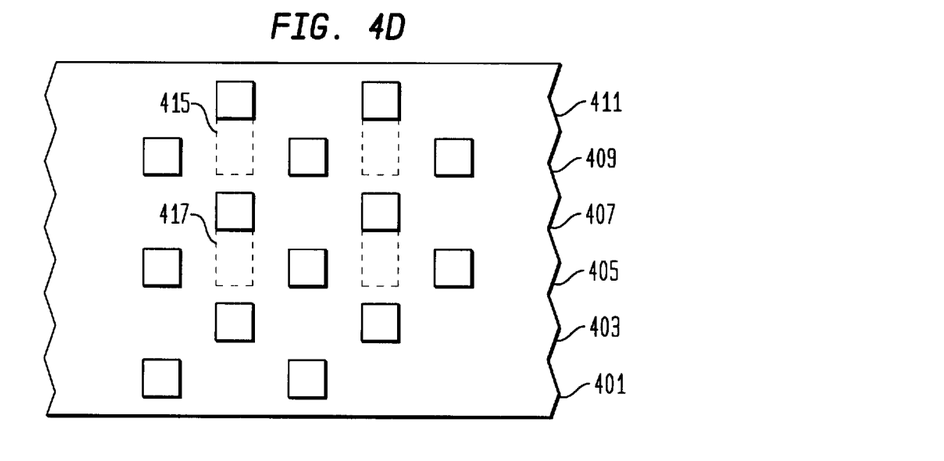

Returning to the example, original metal layer 3 405 is mapped to target metal layers 3, 405 and 4 407, and original metal layer 4 407 is mapped to target metal layers 5 409 and 6 411 in step 404. Next, original metal layer 4 407 is promoted to target metal layer 5 409, leaving layer 4 407 open except for vias 413 up to layer 5 (step 408) as seen in FIG. 4C. Then for layer 3 405, all alternate lines that can be promoted are promoted to layer 4 407 (step 410). Similarly, for layer 5 409, all alternate lines that can be promoted are promoted to layer 6 411 (step 410) as seen in FIG. 4D. Vias 415 and 417 are established.

The present invention may be applied to a wide variety of integrated circuit designs. One example is the ManArray™ architecture implemented in a lower power embodiment. Further details of a presently preferred ManArray core, architecture, and instructions for use in conjunction with the present invention are found in: U.S. patent application Ser. No. 08/885,310 filed Jun. 30, 1997, now U.S. Pat. No. 6,023,753; U.S. patent application Ser. No. 08/949,122 filed Oct. 10, 1997, now U.S. Pat. No. 6,167,502; U.S. patent application Ser. No. 09/169,256 filed Oct. 9, 1998, now U.S. Pat. No. 6,167,501; U.S. patent application Ser. No. 09/169,072 filed Oct. 9, 1998, now U.S. Pat. No. 6,219,776; U.S. patent application Ser. No. 09/187,539 filed Nov. 6, 1998, now U.S. Pat. No. 6,151,668; U.S. patent application Ser. No. 09/205,558 filed Dec. 4, 1998, now U.S. Pat. No. 6,173,389; U.S. patent application Ser. No. 09/215,081 filed Dec. 18, 1998, now U.S. Pat. No. 6,101,592 U.S. patent application Ser. No. 09/228,374 filed Jan. 12, 1999, now U.S. Pat. No. 6,216,223; U.S. patent application Ser. No. 09/471,217 filed Dec. 23, 1999, now U.S. Pat. No. 6,260,082; U.S. patent application Ser. No. 09/472,372 filed Dec. 23, 1999, now U.S. Pat. No. 6,256,683; U.S. patent application Ser. No. 09/543,473 filed Apr. 15, 2000, now U.S. Pat. No. 6,321,322; U.S. patent application Ser. No. 09/238,446 filed Jan. 28, 1999, U.S. patent application Ser. No. 09/267,570 filed Mar. 12, 1999; U.S. patent application Ser. No. 09/337,839 filed Jun. 22, 1999; U.S. patent application Ser. No. 09/350,191 filed Jul. 9, 1999; U.S. patent application Ser. No. 09/422,015 filed Oct. 21, 1999; U.S. patent application Ser. No. 09/432,705 filed Nov. 2, 1999; U.S. patent application Ser. No. 09/596,103 filed Jun. 16, 2000; U.S. patent application Ser. No. 09/598,567 filed Jun. 21, 2000; U.S. patent application Ser. No. 09/598,564 filed Jun. 21, 2000; U.S. patent application Ser. No. 09/598,566 filed Jun. 21, 2000, U.S. patent application Ser. No. 09/598,558 filed Jun. 21, 2000; U.S. patent application Ser. No. 09/598,084 filed Jun. 21, 2000; U.S. patent application Ser. No. 09/599,980 filed Jun. 22, 2000 U.S. patent application Ser. No. 09/711,218 filed Nov. 9, 2000; U.S. patent application Ser. No. 09/747,056 filed Dec. 12, 2000; U.S. patent application Ser. No. 09/853,989 filed May 11, 2001; U.S. patent application Ser. No. 09/886,855 filed Jun. 21, 2001 U.S. patent application Ser. No. 09/791,940 filed Feb. 23, 2001; U.S. patent application Ser. No. 09/792,819 filed Feb. 23, 2001; U.S. patent application Ser. No. 09/792,256 filed Feb. 23, 2001; U.S. patent application Ser. No. 10/013,908 entitled "Methods and Apparatus for Efficient Vocoder Implementations" filed Oct. 19, 2001; U.S. serial application Ser. No. 10/004,010 entitled "Methods and Apparatus for Efficient Complex Long Multiplication and Covariance Matrix Implementation, filed Nov. 1, 2001; Provisional Application Serial No. 60/251,072 filed Dec. 4, 2000; Provisional Application Serial No. 60/281,523 filed Apr. 4, 2001; Provisional Application Serial No. 60/283,582 filed Apr. 13, 2001; Provisional Application Serial No. 60/287,270 filed Apr. 27, 2001; Provisional Application Serial No. 60/288,965 filed May 4, 2001; Provisional Application Serial No. 60/298,624 filed Jun. 15, 2001; Provisional Application Serial No. 60/298,695 filed Jun. 15, 2001; Provisional Application Serial No. 60/298,696 filed Jun. 15, 2001; Provisional Application Serial No. 60/318,745 filed Sep. 11, 2001; Provisional Application Serial No. 60/340,620 entitled "Methods and Apparatus for Video Coding" filed Oct. 30, 2001; and Provision Application Serial No. 60/335,159 entitled "Methods and Apparatus for a Bit Rake Instruction" filed Nov. 1, 2001, all of which are assigned to the assignee of the present invention and incorporated by reference herein in their entirety.

Figure 5:
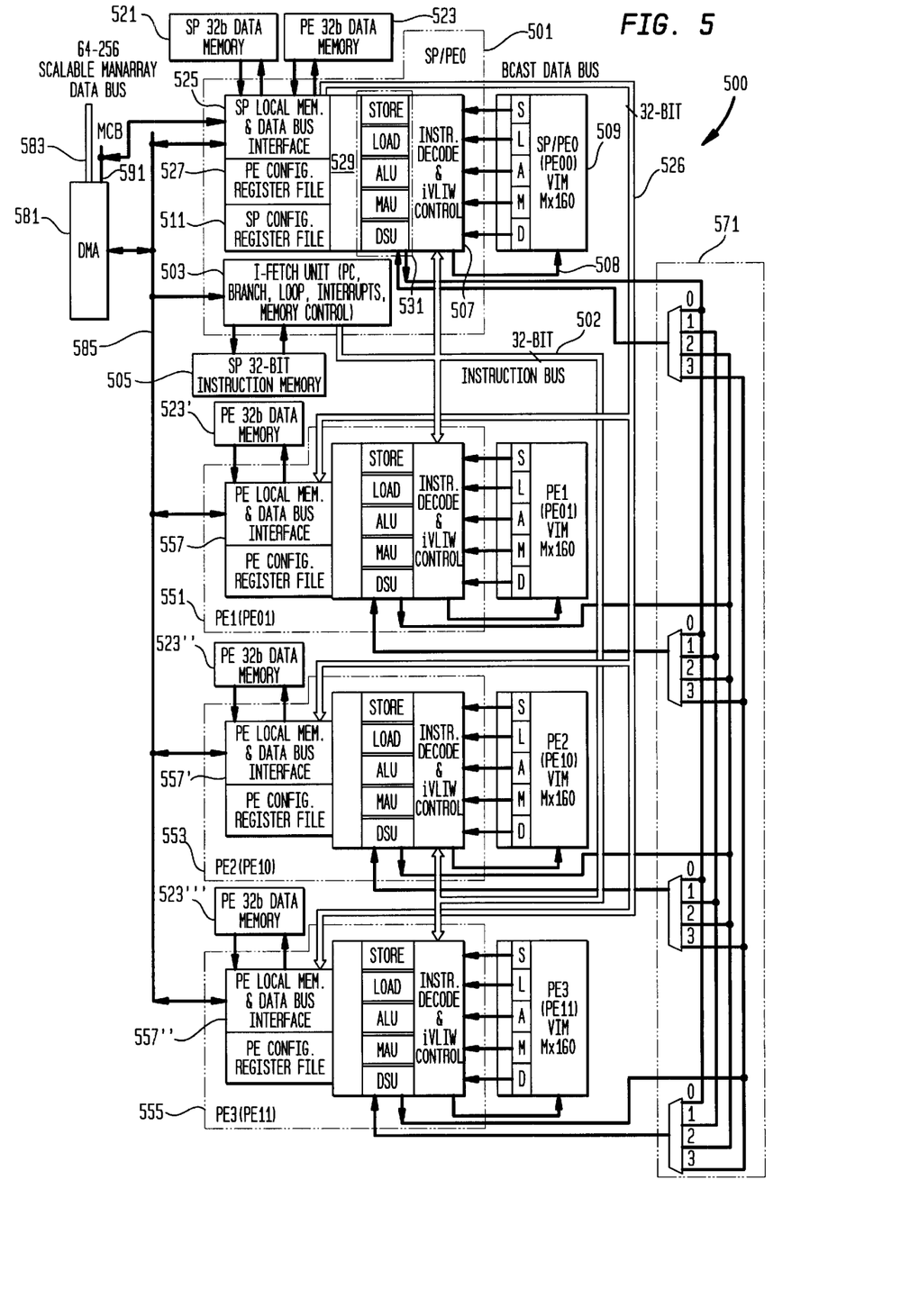
FIG. 5 illustrates an exemplary ManArray™ architecture which may be advantageously implemented utilizing the present invention.

An exemplary ManArray™ 2×2 iVLIW single instruction multiple data stream (SIMD) processor 500 which may be advantageously implemented in a low power embodiment utilizing the advantageous design and routing techniques of the present invention is shown in FIG. 5. Processor 500 contains a controller sequence processor (SP) combined with processing element-0 (PE0) SP/PE0 501, as described in further detail in U.S. Pat. No. 6,219,776 entitled "Methods and Apparatus for Dynamically Merging an Array Controller with an Array Processing Element". Three additional PEs 551, 553, and 555 are also utilized to demonstrate improved parallel array processing with a simple programming model in accordance with the present invention. It is noted that the PEs can be also labeled with their matrix positions as shown in parentheses for PE0 (PE00) 501, PE1 (PE01)551, PE2 (PE10) 553, and PE3 (PE11) 555. The SP/PE0 501 contains a fetch controller 503 to allow the fetching of short instruction words (SIWs) from a 32-bit instruction memory 505. Th fetch controller 503 provides the typical functions needed in a programmable processor such as a program counter (PC), branch capability, digital signal processing loop operations, support for interrupts, and also provides the instruction memory management control which could include an instruction cache if needed by an application. In addition, the SIW I-Fetch controller 503 dispatches 32-bit SIWs to the other PEs in the system by means of a 32-bit instruction bus 502.

In this exemplary system, common elements are used throughout to simplify the explanation, though actual implementations are not so limited. For example, the execution units 531 in the combined SP/PE0 501 can be separated into a set of execution units optimized for the control function, e.g. fixed point execution units, and the PE0 as well as the other PEs 551, 553 and 555 can be optimized for a coating point application. For the purposes of this description, it is assumed that the execution units 531 are of the same type in the SP/PE0 and the other PEs. In a similar manner, SP/PE0 and the other PEs use a five instruction slot iVLIW architecture which contains a very long instruction word memory (VIM) memory 509 and an instruction decode and VIM controller function unit 507 which receives instructions as dispatched from the SP/PE0's I-Fetch unit 503 and generates th VIM addresses-and-control signals 508 required to access the iVLIWs stored in the VIM. Th se iVLIWs are identified by the letters SLAMD in VIM 509. The loading of the iVLIWs is d scribed in further detail in U.S. Pat. No. 6,151,668 entitled "Methods and Apparatus for Efficient Synchronous MJMD Operations with iVLIW PE-to-PE Communication". Also contained in the SP/PE0 and the other PEs is a common PE configurable register file 527 which is described in further detail in U.S. patent application Ser. No. 09/169,255 entitled "Methods and Apparatus for Dynamic Instruction Controlled Reconfiguration Register File with Extended Precision".

Due to the combined nature of the SP/PE0, the data memory interface controller 525 must handle the data processing needs of both the SP controller, with SP data in memory 521, and PE0, with PE0 data in memory 523. The SP/PE0 controller 525 also is the source of the data that is sent over the 32-bit broadcast data bus 526. The other PEs 551, 553, and 555 contain common physical data memory units 523', 523", and 523'" though the data stored in them is generally different as required by the local processing done on each PE. The interface to these PE data memories is also a common design in PEs 1, 2, and 3 and indicated by PE local memory and data bus interface logic 557, 557'and 557". Interconnecting the PEs for data transfer communications is the cluster switch 571 more completely described in U.S. Pat. No. 6,023,753 entitled "Manifold Array Processor", U.S. Pat. No. 6,167,502 entitled "Methods and Apparatus for Manifold Array Processing", and U.S. Pat. No. 6,167,501 entitled "Methods and Apparatus for ManArray PE-to-PE Switch Control". The interface to a host processor, other peripheral devices, and/or external memory can be done in many ways. The primary mechanism shown for completeness is contained in a direct memory access (DMA) control unit 581 that provides a scalable ManArray data bus 583 that connects to devices and interface units external to the ManArray core. The DMA control unit 581 provides the data flow and bus arbitration mechanisms needed for these external devices to interface to the ManArray core memories via the multiplexed bus interface represented by line 585. A high level view of a ManArray Control Bus (MCB) 591 is also shown.

Turning now to specific details of the ManArray™ architecture as advantageously implemented utilizing the present invention, the present approach is expected to provide a variety of benefits. For example, as seen in FIG. 5, there are a number of 32-bit instruction busses connecting the PEs. These busses involve 32 conductors which, when physically routed in a chip design, will be parallel over an extended length. Thus, by utilizing the present invention to promote conductors from one metallization layer to another to improve the spacing of these conductors, substantial reductions in capacitive coupling and power savings are expected.

Figure 6:
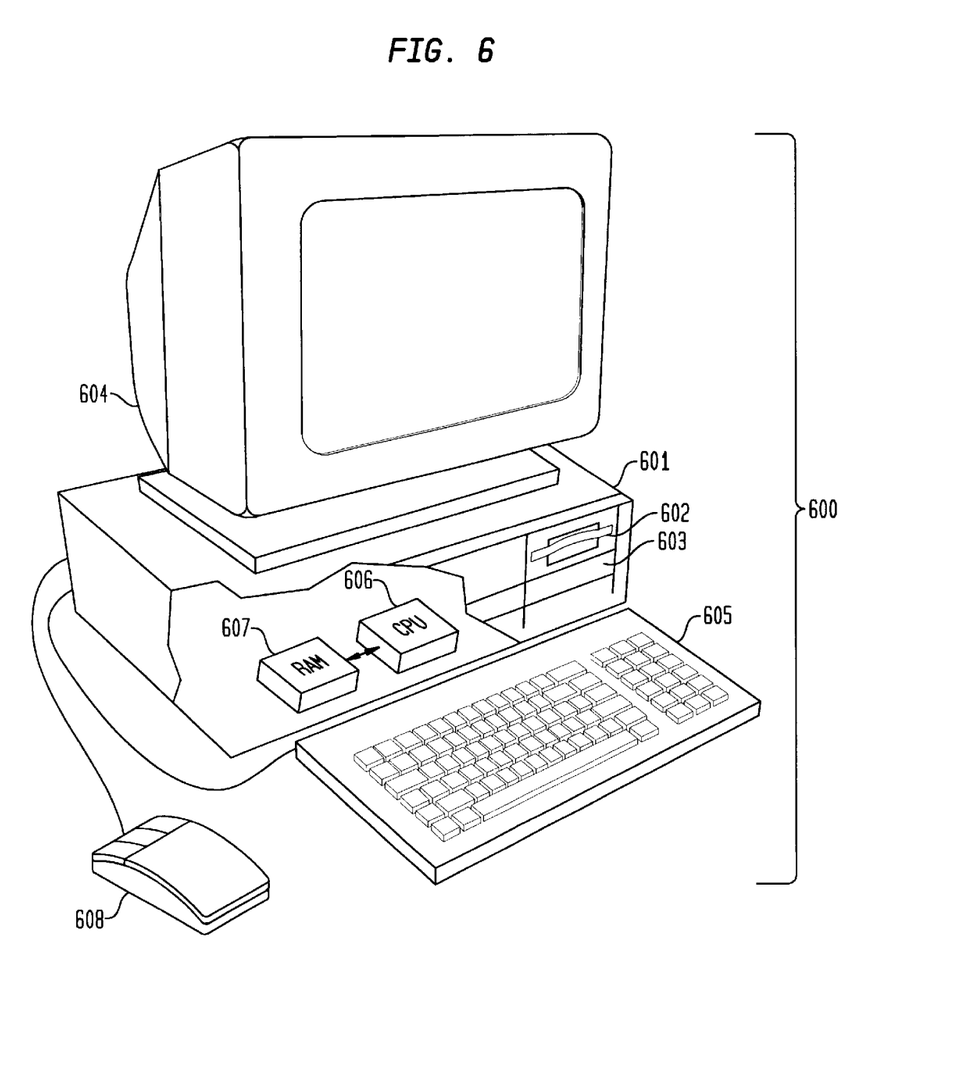
FIG. 6 illustrates an exemplary embodiment of a design and routing system in accordance with the present invention.

FIG. 6 illustrates an exemplary design and route system 600 in accordance with the present invention. System 600 is embodied as a personal computer or server which is programmed to operate in accordance with the methods of FIGS. 3 and 4A and in addition is programmed to perform standard place and route design operations utilizing commercially available place and route software tools adapted as taught herein. As illustrated in FIG. 6, system 600 is comprised of a hardware casing 601 (illustrated having a cut-away view), a monitor 604, a keyboard 605, and a mouse 608. The monitor 604, and the keyboard 605 and mouse 608 may be replaced by, or combined with, other suitably arranged output and input devices, respectively. System 600 preferable includes conventional telephony device and system technologies (not shown), such as a modem and/or an ISDN board, as examples, for transmitting and receiving design data and signals in accordance with the principles of the present invention.

Hardware casing 601 includes both a floppy disk drive 602 and a hard disk drive 603. Floppy disk drive 602 is operable to receive, read, and write to external disks, and hard disk drive 603 is operable to provide fast access data storage and retrieval. Although only floppy disk drive 602 is illustrated, personal computer 600 may be equipped with any suitably arranged structure for receiving and transmitting data, including, for example, video conferencing and collaboration system and device technologies, tape and compact disc drives, digital video disk drives, and serial and parallel data ports.

Illustrated within the cut away portion of hardware casing 601 is a processing unit 606, coupled with a memory storage device 607, which in the illustrated embodiment is a random access memory ("RAM"). Although system 600 is shown having a single processing unit 606, system 600 may be equipped with a plurality of processing units 606 operable to carry out cooperatively the principles of the present invention. Similarly, although system 600 is shown having the single hard disk drive 603 and memory storage device 607, system 600 may be equipped with any suitably arranged memory storage device, or plurality of storage devices. Further, although system 600 is utilized to illustrate an embodiment of the present invention, any processing system having at least one processing unit which operates in conjunction with suitable software and design input data, including, for example, mini, main frame, and super computers, including RISC and parallel processing architectures, as well as processing system network combinations of the foregoing, may be utilized as a system in accordance with the principles of the present invention.

While the present invention has been disclosed in a presently preferred context, it will be recognized that the present invention may be variously embodied consistent with the disclosure and the claims which follow below. By way of example, while the present invention is disclosed in the context of its advantageous application to physical design layout of the BOPS ManArray™ architecture, it will be recognized that it will be applicable generally to the reduction of capacitive power dissipation in integrated circuit designs as line separation or pitch is reduced, line height increases, clock speeds increase, and the like. Further, while for the sake of simplicity the present application speaks of layers, it will be recognized that a layer can be subdivided into two or more regions and the invention can be applied to each of a plurality of regions to promote different layers. Similarly, one region can be used for a purpose such as power distribution while another region can be used for promotion as taught herein.

We claim:

1. A computer implemented method for routing and placement of connectors in an integrated circuit comprising the steps of:

identifying a plurality of at least three long parallel connectors in a first metallization layer in an integrated circuit design description;

promoting at least one of said plurality of long parallel connectors to a different second metallization layer in the integrated circuit design description to form a modified integrated circuit design description; and fabricating the integrated circuit based on the modified integrated circuit design description.

2. The method of claim 1 wherein the integrated circuit is fabricated utilizing a 0.25 micron or smaller fabrication process.

3. The method of claim 1 further comprising the steps of:

initially laying out a design for the integrated circuit utilizing a number of metallization layers for the layout;

reserving at least one additional metallization layer for promotion of long parallel connectors; and promoting said at least one of said plurality of long parallel connectors to said at least one reserved metallization layer.

4. The method of claim 1 further comprising the step of:

systematically and auto automatically identifying all parallel connectors in the integrated circuit design description exceeding a predetermined physical length in the integrated circuit design description, wherein the identified parallel connectors comprise said at least three long parallel conductors.

5. The method of claim 1 further comprising the step of:

systematically and automatically identifying all parallel connectors in the integrated circuit design description which are switched more rapidly than a predetermined minimum, wherein the identified parallel connectors comprise said at least three long parallel conductors.

6. The method of claim 1 further comprising the step of:

fabricating a via to connect the at least second one of said plurality of long parallel connectors to a component on the first metallization layer.

7. The method of claim 1 wherein the plurality of at least three long parallel connectors are bus connectors for connecting processing elements in a multiprocessor array.

8. The method of claim 7 wherein said plurality of parallel connectors is at least thirty-two.

9. A system for routing and placement of connectors in an integrated circuit comprising:

means for identifying a plurality of at least three long parallel connectors in a first metallization layer in an integrated circuit design description;

means for promoting at least a second one of said plurality of long parallel connectors to a different second metallization layer in the integrated circuit design description to form a modified integrated circuit design description; and means for fabricating the integrated circuit based on the modified integrated circuit design description.

10. The system of claim 9 wherein the integrated circuit is fabricated utilizing a 0.25 micron or smaller fabrication process.

11. The system of claim 9 further comprising:

means for initially laying out a design for the integrated circuit utilizing a number of metallization layers for the layout;

means for reserving at least one additional metallization layer for promotion of long parallel connectors; and means for promoting said at least one of said plurality of long parallel connectors to said at least one reserved metallization layer.

12. The system of claim 9 further comprising:

means for systematically and automatically identifying all parallel connectors in the integrated circuit design description exceeding a predetermined physical length in the integrated circuit design description, wherein the identified parallel connectors comprise said at least three long parallel connectors.

13. The system of claim 9 further comprising:

means for systematically and automatically identifying all parallel connectors in the integrated circuit design description which are switched more rapidly than a predetermined minimum, wherein the identified parallel connectors comprise said at least three long parallel connectors.

14. The system of claim 9 further comprising:

means for fabricating a via to connect the at least second one of said plurality of long parallel connectors to a component on the first metallization layer.

15. The system of claim 9 wherein the plurality of at least three long parallel connectors are bus connectors for connecting processing elements in a multiprocessor array.

16. The system of claim 15 wherein said plurality of parallel connectors is at least thirty-two.

17. A computer program product comprising a computer readable medium on which is stored program instructions for a method for routing and placement of connectors in an integrated circuit, the method comprising:

identifying a plurality of at least three long parallel connectors in a first metallization layer in an integrated circuit design description;

promoting at least one of said plurality of long parallel connectors to a different second metallization layer in the integrated circuit design description to form a modified integrated circuit design description; and outputting the modified integrated circuit design description.

* * * * *